United States Patent [19]

Maeda et al.

[11] Patent Number: 4,755,863
[45] Date of Patent: Jul. 5, 1988

[54] SEMICONDUCTOR DEVICE HAVING A SEMICONDUCTOR SUBSTRATE WITH A HIGH IMPURITY CONCENTRATION

[75] Inventors: Satoshi Maeda, Yokohama, Japan; Hiroshi Iwai, Palo Alto, Calif.

[73] Assignee: Kabushiki Kaisha Toshiba, Kawasaki, Japan

[21] Appl. No.: 895,599

[22] Filed: Aug. 15, 1986

Related U.S. Application Data

[63] Continuation of Ser. No. 601,373, Apr. 17, 1984, abandoned.

[30] Foreign Application Priority Data

| Apr. 21, 1983 | [JP] | Japan | 58-70426 |
| Apr. 21, 1983 | [JP] | Japan | 58-70427 |
| Apr. 21, 1983 | [JP] | Japan | 58-70428 |
| Apr. 30, 1983 | [JP] | Japan | 58-76453 |

[51] Int. Cl.$^4$ ............... H01L 29/78; H01L 27/12; H01L 29/04; H01L 29/06
[52] U.S. Cl. ................... 357/49; 357/23.1; 357/23.11; 357/56; 357/59; 357/89; 357/90
[58] Field of Search .............. 357/23.1, 23.6, 23.9, 357/23.11, 42, 47, 49, 50, 55, 59, 56, 89, 90

[56] References Cited

U.S. PATENT DOCUMENTS

| 3,728,161 | 4/1973 | Moline | 357/23.11 |
| 3,966,501 | 6/1976 | Nomura et al. | 357/91 |
| 4,101,350 | 7/1978 | Possley et al. | 357/50 |
| 4,251,828 | 2/1981 | Sakuri | 357/56 |
| 4,329,704 | 5/1982 | Sakuri et al. | 357/23.6 |
| 4,331,708 | 5/1983 | Hunter | 357/49 |
| 4,338,622 | 7/1982 | Feth et al. | 357/49 |
| 4,412,868 | 11/1983 | Brown et al. | 357/49 |
| 4,434,433 | 2/1984 | Nishizawa | 357/23.6 |
| 4,441,246 | 4/1984 | Redwine | 357/23.6 |
| 4,467,040 | 7/1984 | Ho et al. | 357/55 |
| 4,471,525 | 9/1984 | Sasaki | 357/49 |
| 4,487,639 | 12/1984 | Lam et al. | 357/49 |
| 4,504,333 | 3/1985 | Kurosawa | 357/49 |
| 4,514,747 | 4/1985 | Miyata et al. | 357/20 |

FOREIGN PATENT DOCUMENTS 57-56961 4/1982 Japan ..................... 357/42

OTHER PUBLICATIONS

A. S. Grove, *Physics and Technology, of Semiconductor Devices*, John Wiley & sons, New York (1967), pp 78-83.

Primary Examiner—J. Carroll
Attorney, Agent, or Firm—Finnegan, Henderson, Farabow, Garrett & Dunner

[57] ABSTRACT

A high-performance, high-integration, and a highly reliable semiconductor device has a semiconductor substrate, an element isolation layer of an insulating material which is formed on the semiconductor substrate, a monocrystalline semiconductor layer formed on the portion of the semiconductor substrate and isolated from the element isolation layer, and a semiconductor element formed in the monocrystalline semiconductor layer. The impurity concentration of at least the surface region of the semiconductor substrate which is covered with the element isolation layer is not less than $10^{16}/cm^3$.

3 Claims, 16 Drawing Sheets

SEMICONDUCTOR DEVICE HAVING A SEMICONDUCTOR SUBSTRATE WITH A HIGH IMPURITY CONCENTRATION This application is a continuation of application Ser. No. 601,373, filed Apr. 17, 1984, abandoned.

BACKGROUND OF THE INVENTION

The present invention relates to a semiconductor device and a method of manufacturing the same and, more particularly, to a method of manufacturing a semiconductor device having an improved element isolation step.

As is known, in a semiconductor device manufacturing process, an element isolation region (field insulating film) is formed to isolate the element region of the semiconductor substrate from any other region thereof. In particular, along with the high packing density and the high integration of recently developed semiconductor devices, there has arisen a demand to establish a micropatterning technique for forming a smaller element isolation or field region.

The selective oxidation process has been conventionally used as an element isolation method. However, according to this selective oxidation process, a field oxide film extends into the element region to form a so-called bird's beak. Therefore, this method is not suitable for micropatterning.

In consideration of the above situation, the present inventors have already proposed a proper element isolation method suitable for micropatterning the element. An example will be described with reference to FIGS. 1A to 1F wherein this method is applied to the manufacture of a MOS transistor.

(i) As shown in FIG. 1A, a p$^-$-type silicon substrate 1 of high resistance is thermally oxidized in a wet oxygen atmosphere at a temperature of 1,000° C. to grow a thermal oxide film (insulating film) 2 to a thickness of 5,000 Å. A photoresist film is coated to cover the entire surface and is patterned by photoengraving to form a resist pattern 3.

(ii) Boron is non-implanted as a field stopper impurity at an acceleration voltage of 200 keV and a dose of $1\times10^{13}$/cm$^2$ by using the resist pattern 3 as a mask, so that p$^+$-type inversion preventive layers 4 are selectively formed in the silicon substrate 1 through the thermal oxide film 2. An aluminum film is deposited by vacuum deposition to cover the entire surface to a thickness of 2,000 Å. The aluminum film is separated into aluminum film portions 5a on the resist pattern 3 and aluminum film portions 5b on the thermal oxide film 2, as shown in FIG. 1B. The resist pattern 3 is removed and the aluminum film portions 5a are lifted off, so that the aluminum film portions 5b are left in a propective element isolation region on the thermal oxide film 2 (FIG. 1C).

(iii) The thermal oxide film 2 is selectively etched by reactive ion etching (RIE) using the remaining aluminum film portions 5b as masks to form a field oxide film 6 (element isolation region). Thereafter, the aluminum film portions 5b on the field oxide film 6 are removed (FIG. 1D).

(iv) Thermal oxidation is performed on an exposed portion of the silicon substrate 1 to form an oxide film of 400 Å thickness which can serve as a gate oxide film. Subsequently, a phosphorus-doped polycrystalline silicon film is deposited to cover the entire surface to a thickness of 4,000 Å. Patterning by the RIE method is performed to form a gate electrode 7. The oxide film is etched using the gate electrode 7 as a mask, thereby forming a gate oxide film 8 (FIG. 1E). Arsenic is diffused using the gate electrode 7 and the field oxide film 6 as masks, so that n$^+$-type source and drain regions 9 and 10 are formed in the silicon substrate 1. Thereafter, a CVD-SiO$_2$ film 11 is deposited to cover the entire surface and is patterned to form contact holes. An aluminum film is deposited and patterned to form aluminum wiring layers 12 and 13, thereby completing preparation of a MOS semiconductor device (FIG. 1F).

However, this conventional method presents the following problem. As shown in FIG. 2A, a thermal oxide film 14 is grown, a phosphorus-doped polycrystalline silicon film 15 is deposited, and a resist film 16 is formed all after the field oxide films 6 are formed. In this case, the resist film 16 has portions formed on the edges of the polycrystalline silicon film 15 which respectively correspond to edges A of the field oxide films 6. These portions have a thickness greater than the remaining portions of a resist film 16. Therefore, when the resist film 16 is developed after exposure, residual resist portions 16' tend to be left at the edges of the field oxide film 6. Excessive development must be performed to remove these resist portions 16'. Therefore, controlling the size of the resist pattern is very difficult. In addition, when the thermal oxide film 14 and the phosphorus-doped polycrystalline silicon film 15 are formed after the field oxide film 6, the thickness ($t_1$) of the flat portion of the polycrystalline silicon film 15 is 4,000 Å, but the thickness ($t_2$) of the stepped portion at each of the edges of the field oxide film 6 is about 9,000 Å. For this reason, when the polycrystalline silicon film 15 is etched by the RIE method to micropattern the gate electrode to be formed, etching occurs only vertically downward from the surface. As a result, as shown in FIG. 3B, residual polycrystalline silicon portions 17 are left at the stepped portions of the field oxide film 6. When a plurality of MOS transistors are formed in a single element region, gate electrodes of the resultant MOS transistors are short-circuited because of the presence of these residual polycrystalline silicon portions 17.

In addition to these disadvantages, when the CVD-SiO$_2$ film 11 and then the aluminum wiring layers 12 and 13 are formed after the field oxide film 6, poor coverage occurs at the shoulders 18 of the steep stepped portions at the edges of the field oxide film 6, so the aluminum wiring layers 12 and 13 tend to be disconnected, as shown in FIG. 4, resulting in inconvenience.

SUMMARY OF THE INVENTION

It is an object of the present invention to provide a semiconductor device of high performance, integration and reliability.

It is another object of the present invention to provide a simple method of manufacturing the semiconductor device described above.

According to an aspect of the present invention, there is provided a semiconductor device comprising a semiconductor substrate, an element isolation layer of an insulating material formed on said semiconductor substrate, a monocrystalline semiconductor layer formed on a portion of said semiconductor substrate and isolated by said element isolation layer, and a semiconductor element formed in said monocrystalline semiconductor layer. The impurity concentration of at least the surface region of the semiconductor substrate which is covered with the element isolation layer is not less than $10^{16}/cm^3$.

The semiconductor substrate comprises a p+- or n+-type semiconductor substrate, or a semiconductor structure consisting of the substrate and a monocrystalline semiconductor region formed thereon.

The insulating film is used as a material for forming an element isolation region. The insulating film comprises a thermal oxide film, a CVD-$SiO_2$ film, a silicon nitride film or an alumina film.

The portions of the semiconductor substrate which have an impurity concentration of not less than $10^{16}/cm^3$ are not limited to the surface region covered with the element isolation layer, but may extend to the entire surface region including that covered with the monocrystalline semiconductor layer or to the whole of the semiconductor substrate.

According to this semiconductor device, the level of the element region of the monocrystalline semiconductor layer is the same as that of the element isolation region. As a result, no resist pattern portions and no residual polycrystalline silicon portions remain and the disconnection of the aluminum wiring layer can be prevented. In addition, a semiconductor substrate with a high concentration (low resistance) is used, so that the change in substrate potential due to substrate current can be suppressed.

According to another aspect of the present invention, there is provided a method of manufacturing a semiconductor device, comprising the steps of:

(a) forming an insulating film on a semiconductor substrate, at least that surface portion of the substrate which is to be covered with an element isolation layer having an impurity concentration of not less than $10^{16}/cm^3$;

(b) selectively etching said insulating film to form said element isolation layer;

(c) forming a monocrystalline semiconductor layer on said semiconductor substrate, which is isolated by said element isolation layer; and (d) forming a semiconductor element in said monocrystalline semiconductor layer.

The region of the semiconductor substrate which has the impurity concentration of not less then $10^{16}/cm^3$ is not limited to the portion on which the element isolation layer is formed, but may extend to the entire surface region including that covered with the monocrystalline semiconductor layer or to the whole of the semiconductor substrate.

There are two methods of performing step (b) as follows:

(1) A resist pattern is formed on the insulating film which is etched using the resist pattern as a mask.

(2) A spacer is formed on the portion of the insulating film which correpsonds to the element region. A material film having etching selectivity with respect to the spacer is formed to cover the entire surface such that the material film is disconnected at the side walls of the spacer due to the step difference between the insulating film and the spacer. The spacer is removed to lift off the overlying material film, and the insulating film is etched using the residual material film as mask on the insulating film. A resist film is used as the spacer, and a metal film is used as the material film.

According to method (2), a micropatterned element isolation layer can be formed with high precision.

There are four methods of performing step (c) as follows:

(1) A nonmonocrystalline semiconductor layer is formed to cover the semiconductor substrate having the element isolation layer thereon. An energy beam is irradiated to convert the nonmonocrystalline semiconductor layer to a monocrystalline semiconductor layer, and this resultant monocrystalline semiconductor layer is selectively etched to remove the monocrystalline semiconductor layer portion on the element isolation layer. Selective etching of the monocrystalline semiconductor layer can be performed by an etching-back method.

(2) A nonmonocrystalline semiconductor layer is formed to cover the semiconductor substrate having the element isolation layer thereon and is selectively etched to remove the nonmonocrystalline semiconductor layer portion on the element isolation layer. An energy beam is irradiated to convert the residual nonmonocrystalline semiconductor layer on the semiconductor substrate to a monocrystalline semiconductor layer. Selective etching of the nonmonocrystalline semiconductor layer can be performed by the etching-back method.

A polycrystalline silicon layer or an amorphous silicon layer can be used as the nonmonocrystalline semiconductor layer in methods (1) and (2). A laser or electron beam can be used as the energy beam.

(3) A monocrystalline semiconductor layer is formed by the selective epitaxial growth method on the surface region of the semiconductor substrate which is surrounded by the element isolation layer.

(4) A semiconductor layer is epitaxially grown on the entire surface of the semiconductor substrate having the element isolation layer. A polycrystalline semiconductor layer is formed on the element isolation layer. A monocrystalline semiconductor layer is formed on the surface region of the semiconductor substrate which is surrounded by the element isolation layer, and the polycrystalline semiconductor layer portion on the element isolation layer is removed.

According to the manufacturing method of the present invention, a micropatterned element isolation region can be formed by a simple process. In addition, since the level of the element isolation region is the same as that of the element region of the monocrystalline semiconductor layer, no resist pattern portions in the vicinity of the edges of the element isolation region and no polycrystalline silicon film remain, and the disconnection of the aluminum wiring can be prevented. Furthermore, since the semiconductor substrate has a high concentration (low resistance), the channel stopper under the element isolation region can be omitted. At the same time, the change in substrate potential due to the current flowing through the base (substrate) can be suppressed, thereby producing a high-performance semiconductor device.

DETAILED DESCRIPTION OF THE PREFERRED EMBODIMENTS

The present invention will now be described in detail with reference to the accompanying drawings in way of examples wherein the present invention is applied to n-channel MOS-type semiconductor devices. In Examples 1 to 10, respectively, monocrystalline semiconductor layers of the element regions are formed using an energy beam. In Examples 11 to 23, respectively, monocrystalline semiconductor layers of the element regions are formed using the epitaxial growth method.

EXAMPLE 1

Figure 1A:
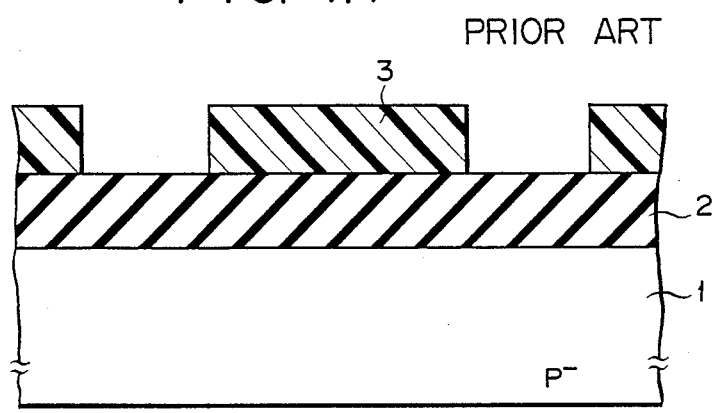
FIGS. 1A to 1F are sectional views showing the steps of manufacturing a conventional MOS-type semiconductor device which has already been proposed by the present inventors.
Figure 1B:
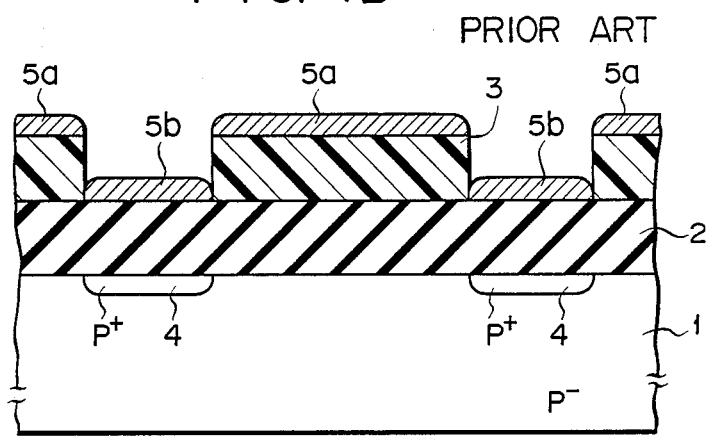
Figure 1C:
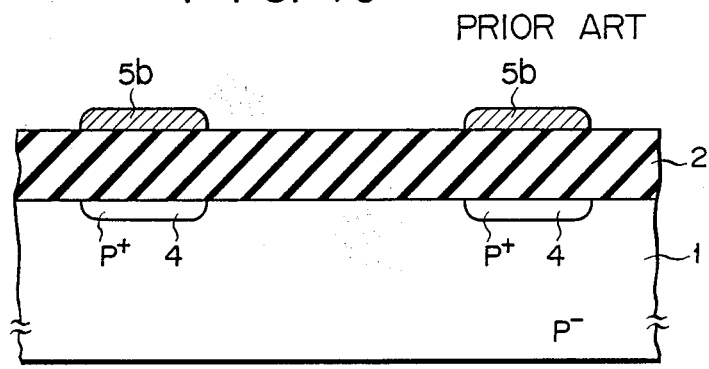
Figure 1D:
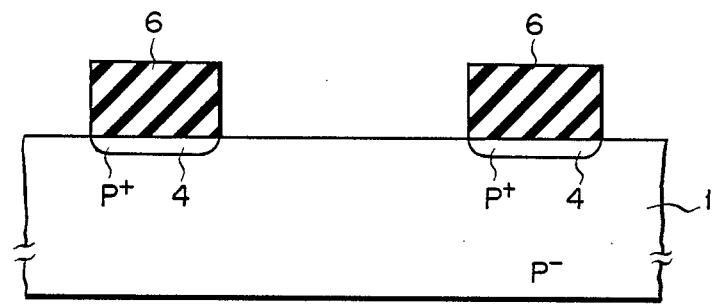
Figure 1E:
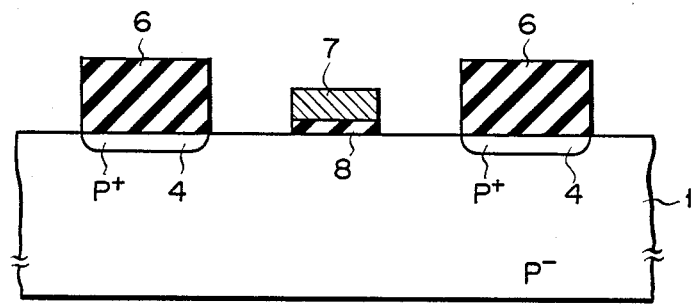
Figure 1F:
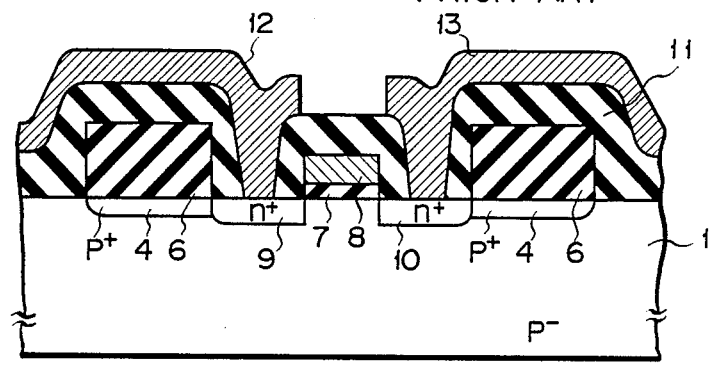
Figure 2A:
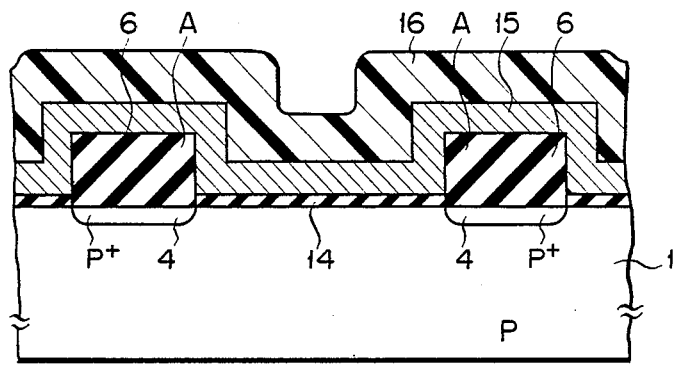
FIGS. 2A and 2B are sectional views showing one drawback of the manufacturing steps of FIGS. 1A to 1F.
Figure 2B:
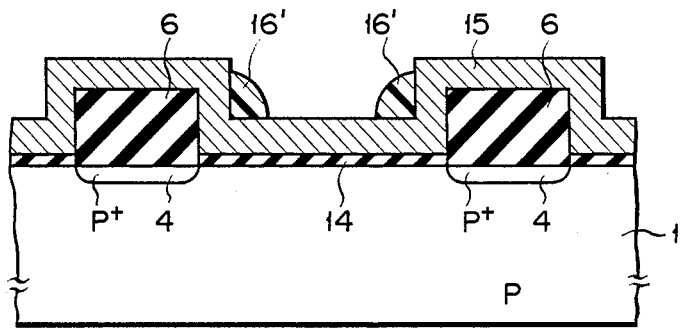
Figure 3A:
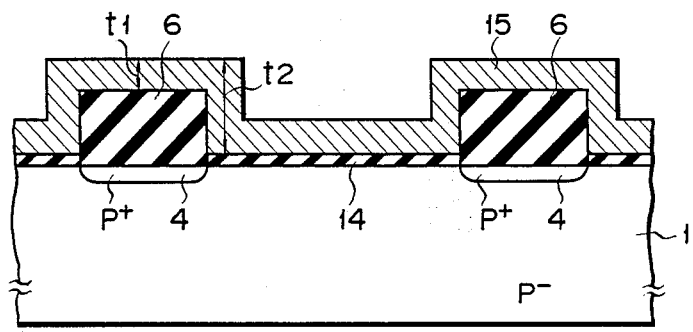
FIGS. 3A and 3B are sectional views showing another drawback of the manufacturing steps of FIGS. 1A to 1F.
Figure 3B:
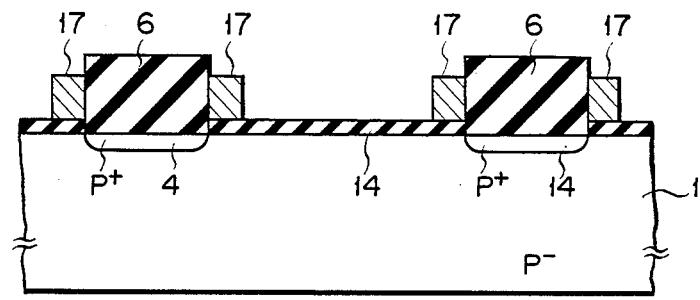
Figure 4:
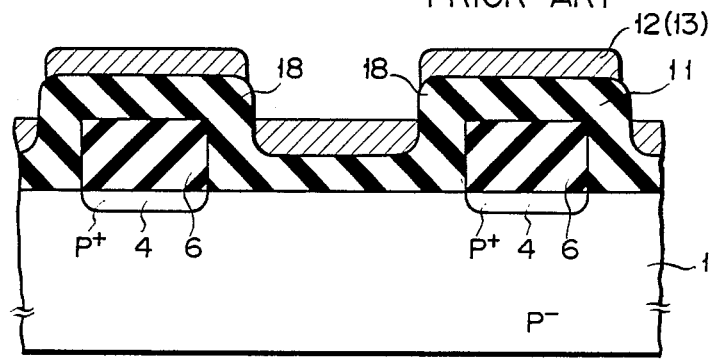
FIG. 4 is a sectional view showing still another drawback of the manufacturing steps of FIGS. 1A to 1F.
Figure 5A:
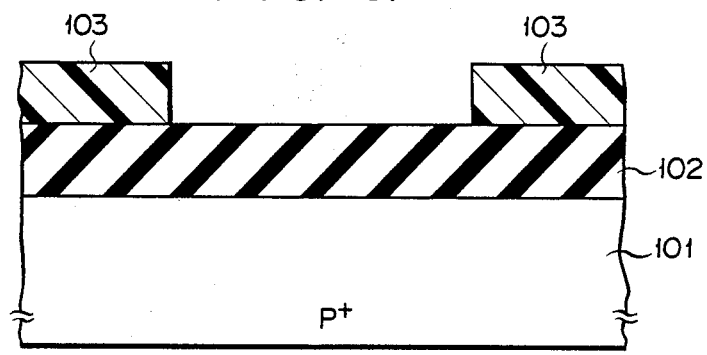
FIGS. 5A to 5G are sectional views showing the steps in manufacturing a MOS-type semiconductor device according to Example 1 of the present invention.

(i) An $SiO_2$ film (insulating film) 102 was grown by the CVD method on a p+-type silicon substrate 101 which contained as an impurity boron having an impurity concentration of not less than $10^{16}/cm^3$ (e.g., $1 \times 10^{18}/cm^3$) and which had the (100) plane. Subsequently, a photoresist film was applied to the entire surface and was patterned by phtotengraving to form a resist pattern 103 which covered a prospective element region (FIG. 5A).

Figure 5B:
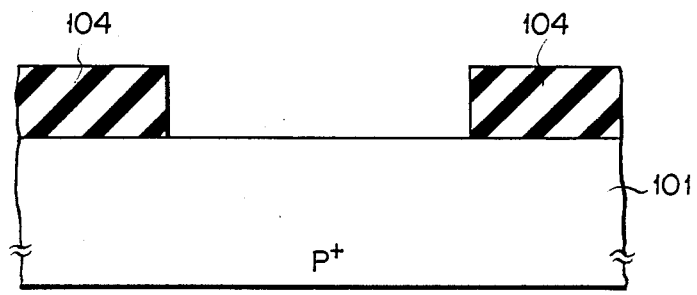

(ii) The $SiO_2$ film 102 was selectively etched by reactive ion etching using the resist pattern 103 as a mask to form an element isolation region (field oxide film) 104. Thereafter, the resist pattern 103 on the element isolation region 104 was removed (FIG. 5B).

Figure 5C:
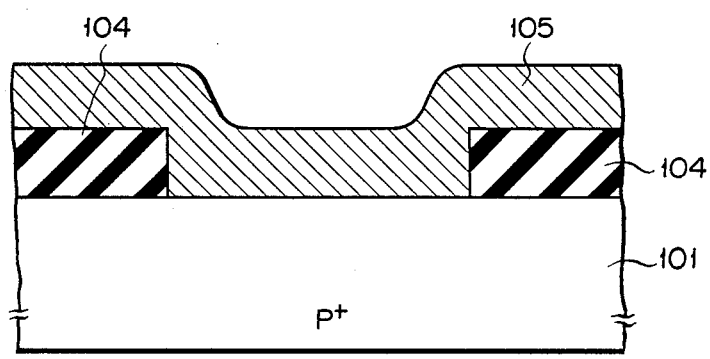
Figure 5D:
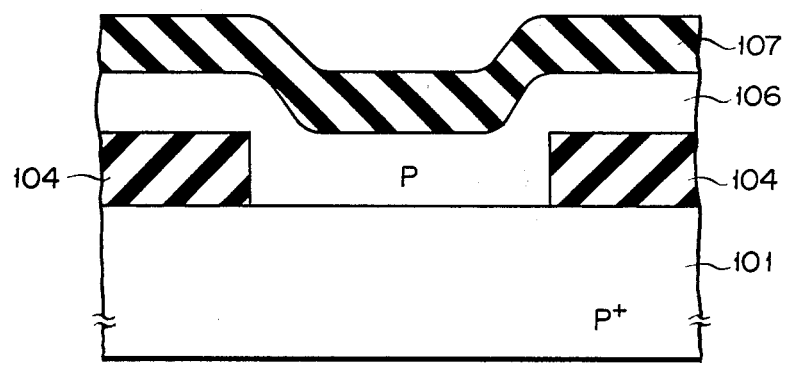
Figure 5E:
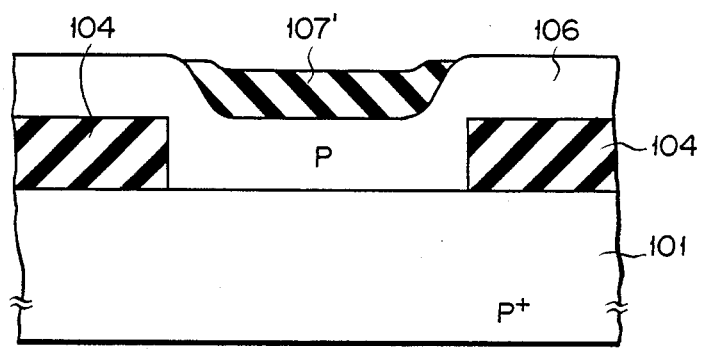
Figure 5F:
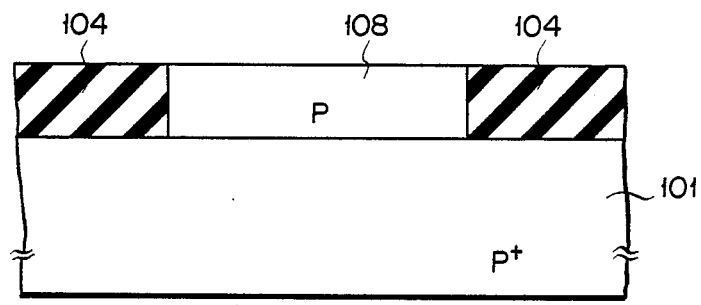

(iii) As shown in FIG. 5C, a polycrystalline silicon layer 105 having the same thickness as that of the element isolation region 104 was deposited to cover the entire surface of the resultant structure. Subsequently, a laser beam irradiated the entire surface of the polycrystalline silicon layer 105 to convert a portion of the p+-type silicon substrate 101 to a p-type monocrystalline silicon layer 106 by using the p+-type silicon substrate 101 as a crystal seed. A plasma nitride film 107 was deposited on the monocrystalline silicon layer 106 (FIG. 5D). Subsequently, reactive ion etching was performed to leave a residual plasma nitride film 107' only in the recess of the monocrystalline silicon layer 106 in a self-aligned manner since the etching rate of the flat portion of the nitride film 107 was higher than that of the portion of nitride film 107 which was deposited in the recess of the monocrystalline silicon layer 106. Thereafter, the residual plasma nitride film 107' and the monocrystalline silicon layer 106 were simultaneously etched under conditions where the etching rates of these films were substantially the same. As a result, an element region 108 of p-type monocrystalline silicon was formed on a surface portion of the p+-type silicon substrate 101 surrounded by the element isolation region 104. Before the source and drain regions are formed, a p-type impurity such as boron may be doped in the element region 108 of monocrystalline silicon so as to control the threshold voltage of the semiconductor element to be formed.

Figure 5G:
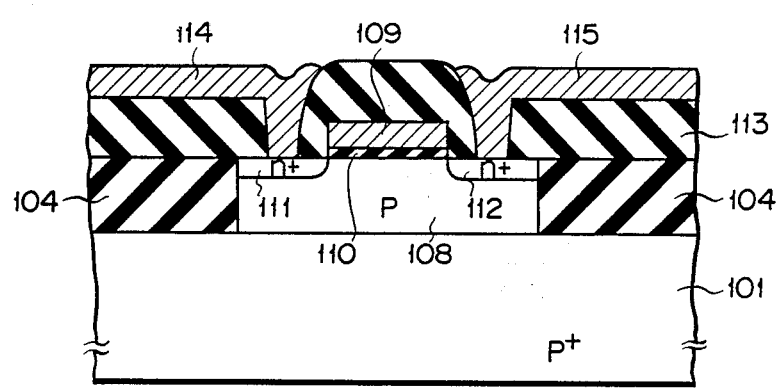

(iv) The element region 108 of p-type monocrystalline silicon surrounded by the element isolation region 104 was heated to grow an oxide film to a thickness of 400 Å. Thereafter, a phosphorus-doped polycrystalline silicon film was deposited on the entire surface of the oxide film to a thickness of 3,000 Å. By using a resist pattern formed by photoengraving as a mask, the polycrystalline silicon film was patterned by reactive ion etching to form a gate electrode 109. Subsequently, the oxide film was selectively etched using the electrode 109 as mask, thereby forming a gate oxide film 110. Arsenic as diffused or ion-implanted using as a mask the gate electrode 109 and the element isolation region 104, so that n+-type source and drain regions 111 and 112 were formed in the element region 108 of the p-type monocrystalline silicon. A $CVD-SiO_2$ film 113 was then deposited to cover the entire surface of the resultant structure and was patterned. An aluminum film was deposited to cover the entire surface of the resultant structure. The aluminum film was then patterned to form a gate aluminum wiring pattern (not shown), and source and drain aluminum wiring patterns 114 and 115, thus preparing a MOS semiconductor device (FIG. 5G).

According to the present invention, the element region 108 of p-type monocrystalline silicon can be simply formed in the portion of the p+-type silicon substrate 101 which is surrounded by and is at the same level as the element isolation region 104. According to the method shown in FIGS. 1A to 1F, a step will not be formed between the element isolation region 104 and the element region 108 formed on the substrate. Therefore, the element region 108 can be smoothened with respect to the element isolation region 104. For this reason, after the the oxide film 110 is formed and the phophorus-doped polycrystalline silicon film is formed in step (iv), the residual resist portions will not be left at the edges of the element isolation region 104 at the time of resist film application and photoengraving. A high precision resist pattern can be formed, and hence the gate electrode 109 can also be formed with high precision. In step (iv), when the phosphorus-doped polycrystalline silicon film is deposited and is selectively etched by reactive ion etching using the resist pattern as a mask, the element isolation region 104 is at the same level as that of the element region 108 of p-type monocrystalline silicon, so that the residual polycrystalline silicon portions after etching will not be left at the element region 108 in the vicinity of the edges of the element isolation region 104. As a result, a highly reliable MOS-type semiconductor device can be prepared wherein a short circuit is not formed between the gate electrode 109, and the source and drain regions 111 and 112. In addition, when the source and drain aluminum wiring patterns 114 and 115 are formed, disconnection of the aluminum wiring patterns 114 and 115 at the edges of the element isolation region 104 does not occur.

Furthermore, in the element isolation region forming process, unlike the selective oxidation method, the bird's beak can be eliminated, so that the element isolation region 104 can be micropatterned, and hence the element region 108 can also be micropatterned. As a result, an MOS-type semiconductor device having a high packing density can be obtained.

Furthermore, since a p+-type silicon substrate 101 containing boron at a high concentration ($10^{18}/cm^3$) is used, the channel stopper can be automatically formed under the element isolation region 104, thereby omitting the need for a special formation process. At the same time, the change in substrate potential due to a substrate current can be controlled. Therefore, an MOS-type semiconductor device having a stable threshold voltage can be obtained.

In the above example, the polycrystalline silicon layer is etched back such that the plasma nitride film is left by the RIE in the recess of the monocrystalline silicon layer, and the residual plasma nitride film and the monocrystalline silicon layer are simultaneously etched. However, formation of the polycrystalline silicon layer is not limited to this etch-back method. For example, according to another etch-back method, after a resist film is formed on a monocrystalline silicon layer having a recess in such a manner that the surface of the monocrystalline silicon layer becomes flat, the resist film is sequentially etched. Thereafter, the exposed monocrystalline silicon layer on the element isolation region and the resist film are simultaneously etched.

EXAMPLE 2

Figure 6A:
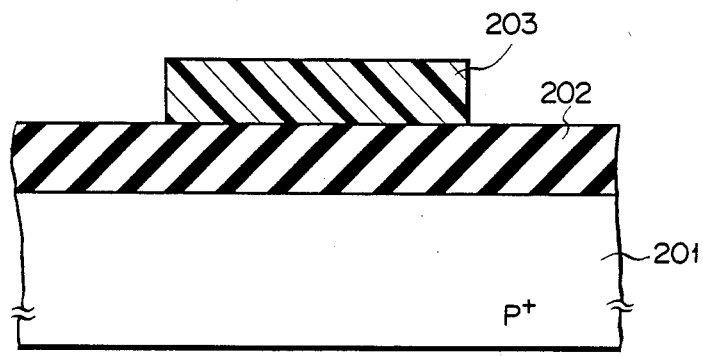
FIGS. 6A to 6E are sectional views showing the steps in manufacturing a MOS-type semiconductor device according to Example 2 of the present invention.

(i) An $SiO_2$ film (insulating film) 202 was formed by the CVD method to a thickness of 2 μm on a p+-type silicon substrate 201 which contained as an impurity boron having a high concentration of not less than $10^{16}/cm^3$ (e.g., $1 \times 10^{18}/cm^3$) and which had the (100) plane. Subsequently, a photoresist film was formed to cover the entire surface and was selectively etched by photoengraving to form a resist pattern (spacer) 203 which covered a prospective element region (FIG. 6A).

Figure 6B:
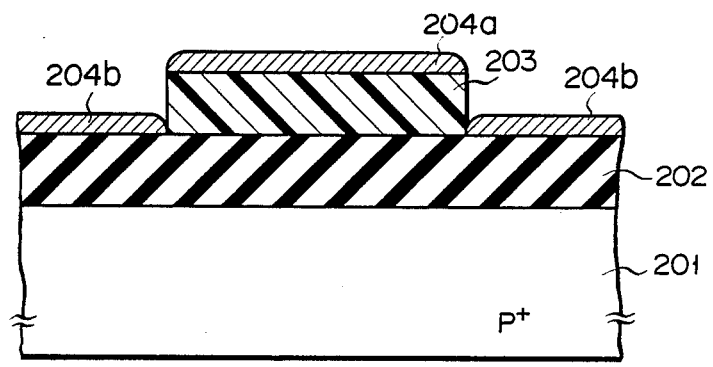
Figure 6C:
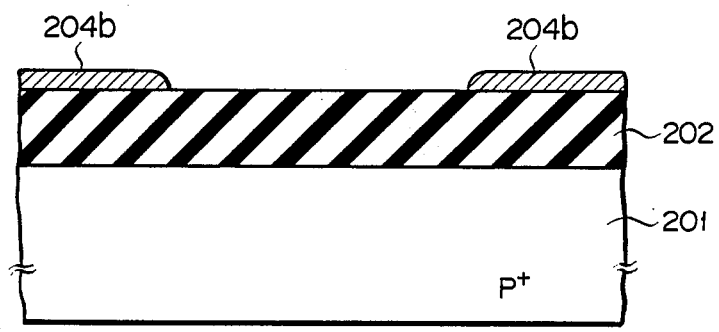
Figure 6D:
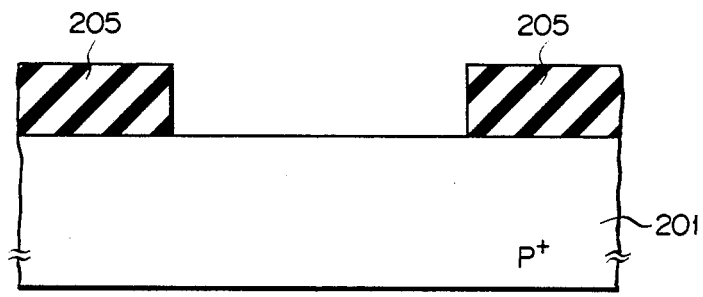

(ii) An aluminum film was formed by vacuum deposition to cover the entire surface of the resultant structure to a thickness of 2,000 Å. In this case, as shown in FIG. 6B, the aluminum film was discretely formed such that an aluminum film 204a was formed on the pattern 203, and an aluminum film 204b was formed on the $SiO_2$ film 202. After the resist pattern 203 was removed, the aluminum film 204a thereon was lifted off, so that the aluminum film 204b was left on the portion of the $SiO_2$ film 202 which correspond to the prospective element isolation region (FIG. 6C). Subsequently, the oxide film 202 was etched by reactive ion etching using the residual aluminum film 204b as a mask to form an element isolation region (field oxide film) 205. Thereafter, the residual aluminum film 204b on the element isolation region 205 was removed (FIG. 6D).

Figure 6E:
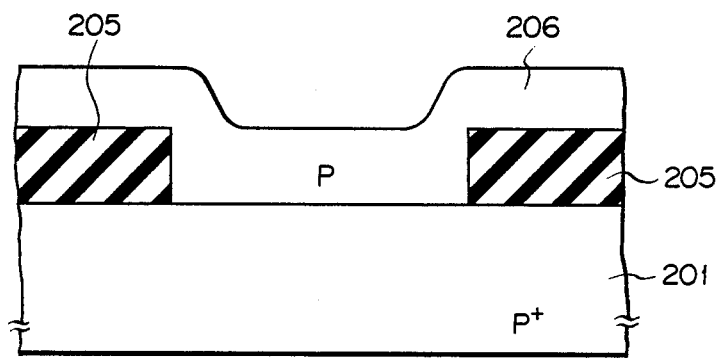

(iii) As shown in FIG. 6E, a polycrystalline silicon layer having the same thickness as that of the element isolation region 205 was deposited to cover the entire surface of the resultant structure. A laser beam was irradiated to convert the polycrystalline silicon layer to a p-type monocrystalline silicon layer 206.

(iv) In the same process as in Example 1, an element region of p-type monocrystalline silicon was formed on the portion of the substrate which was surrounded by the element isolation region. In addition, a gate electrode, a gate oxide film, and source and drain regions were formed to prepare an n-channel MOS-type semiconductor device (not shown).

Example 2 produces the same effect as in Example 1. Furthermore, a micropatterned element isolation region having the same size as that of the resist pattern can be formed.

EXAMPLE 3

Figure 7A:
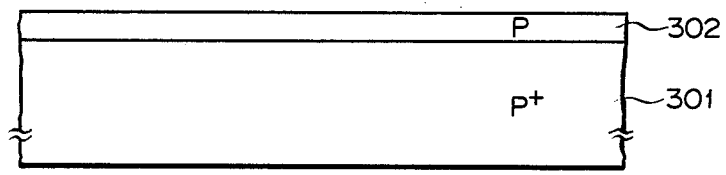
FIGS. 7A and 7B are sectional views showing some of the steps in manufacturing a MOS-type semiconductor device according to Example 3 of the present invention.

(i) A p-type monocrystalline silicon film 302 containing boron having an impurity concentration of not more than $10^{16}/cm^3$ (e.g., $10^{15}/cm^3$) was grown to a thickness of 3 μm on a p+-type silicon substrate 301 containing boron having a concentration of not less than $10^{16}/cm^3$ (e.g., $10^{19}/cm^3$) (FIG. 7A).

Figure 7B:
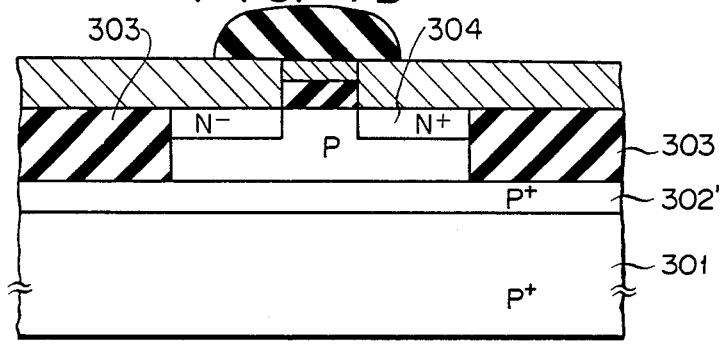

(ii) In the same manner as in Example 1, an element isolation region 303 was formed on the p-type monocrystalline silicon layer. An element region 304 of p-type monocrystalline silicon was formed on a p-type monocrystalline silicon island region surrounded by the element isolation region 303 (FIG. 7B). An n-channel MOS-type semiconductor device (not shown) was prepared in the same manner as in Example 1.

According to Example 3, since a semiconductor substrate is used wherein the p-type monocrystalline silicon film 302 is grown on the p+-type silicon substrate 301, a high concentration of the monocrystalline silicon layer as the element region 304 can be prevented by the p-type monocrystalline silicon film 302 since boron will not be diffused from the substrate 301 to the element region 304. In the annealing process, the silicon film on the p+-type monocrystalline silicon substrate 301 was converted to a p+-type monocrystalline silicon film 302', as shown in FIG. 7B. When the silicon film was not entirely converted to the p+-type film, boron may be further diffused from the p+-type silicon substrate 301 in the subsequent annealing process. Therefore, the channel stopper can be automatically formed under the element isolation region 303, and the concentration of boron in the element region 304 can be controlled.

EXAMPLE 4

Figure 8A:
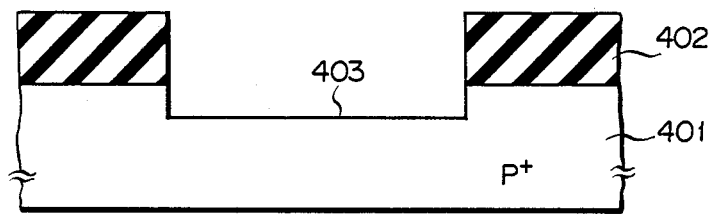
FIGS. 8A to 8B are sectional views showing some of the steps of manufacturing a MOS-type semiconductor device according to Example 4 of the present invention.

(i) After an element isolation region 402 of $SiO_2$ was formed on a p+-type silicon substrate 401 containing boron with a concentration of $10^{18}/cm^3$ in the same manner as in Example 1, the exposed island region of the substrate 401 was etched using the element isolation region 402 as a mask to form a groove 403 (FIG. 8A).

Figure 8B:
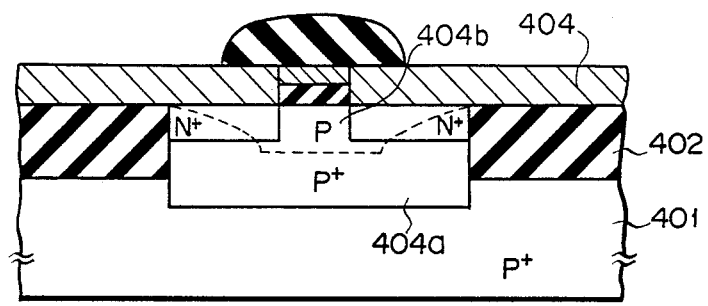

(ii) An element region 404 of p-type monocrystalline silicon was deposited in the groove 403 of the p+-type silicon substrate 401 which is surrounded by the element isolation region 402 in the same manner as in Example 1 (FIG. 8B). The same process as in Example 1 was used to prepare an n-channel MOS-type semiconductor device (not shown).

In this Example, a groove 403 is formed in the region of the substrate 401 which corresponds to the monocrystalline silicon layer. When boron is diffused from the p+-type silicon substrate 401 by annealing after the element region 404 is formed, a p+-type region 404a (inversion preventive region of the element isolation region 402) can be formed only under and at the side surfaces of the p-type monocrystalline silicon layer 404 (element region). Therefore, a p-type region 404b can be formed in the upper portion of the p-type monocrystalline silicon layer.

EXAMPLE 5

Figure 9:
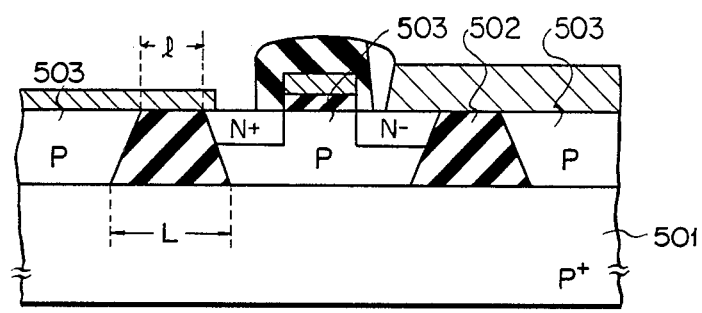
FIG. 9 is a sectional view showing an element isolation layer having a tapered side surface as in Example 5 of the present invention.

After an SiO₂ film was deposited by the CVD method on a p+-type silicon substrate 501, a resist pattern was formed such that the opening thereof corresponds to the prospective element region. The SiO₂ film was etched in a tapered manner by using the resist pattern as mask, so that an element isolation region 502 having tapered side surfaces was formed. Subsequently, an element region 503 of p-type monocrystalline silicon was formed on the island region of the substrate which was surrounded by the element isolation region 502 in the same manner as in Example 1 (FIG. 9).

According to Example 5, the width of the upper portion of the element isolation region 502 can be narrowed, and a micropatterned region can be obtained. In addition, the width L of the lower portion of the element isolation region 502 is wide, so that the short-channel effect of a field parasitic MOS transistor can be prevented.

EXAMPLE 6

Figure 10A:
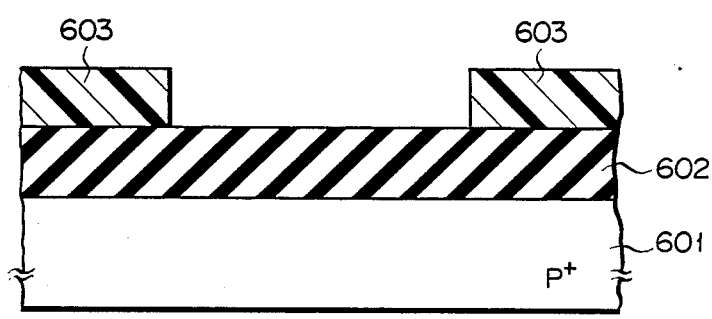
FIGS. 10A to 10G are sectional views showing the steps in manufacturing a MOS-type semiconductor device according to Example 6 of the present invention.
Figure 10B:
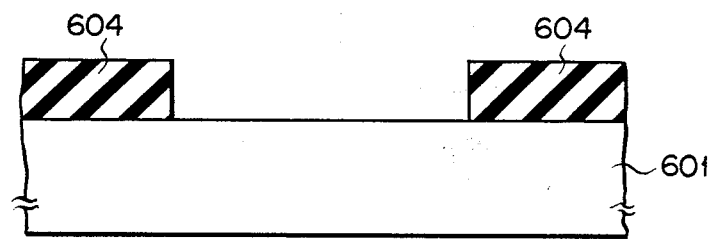

(i) An SiO₂ film (insulating film) 602 was grown by the CVD method to a thickness of 2 μm on a p+-type silicon substrate 601 which contained boron as an impurity having a concentration of not less than $10^{16}$/cm³ (e.g., $1\times10^{18}$/cm³) and which had the (100) plane. Subsequently, a photoresist film was applied to cover the entire surface and was patterned by photoengraving to cover a prospective element isolation region, thereby forming a resist pattern 603 (FIG. 10A). Thereafter, the SiO₂ film 602 was selectively etched by reactive ion etching using the resist pattern 603 as a mask to form an element isolation region (field oxide film) 604. The resist pattern on the element isolation region 604 was removed (FIG. 10B).

Figure 10C:
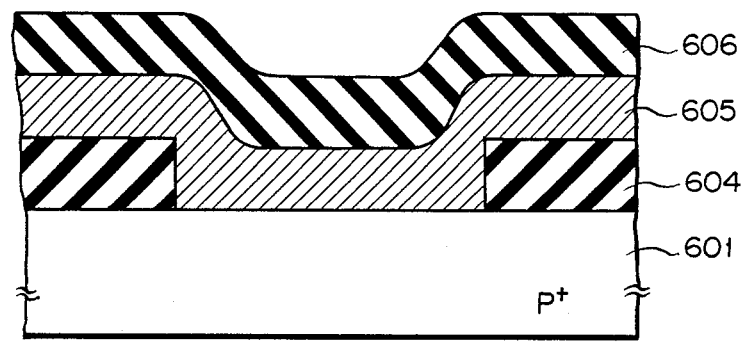
Figure 10D:
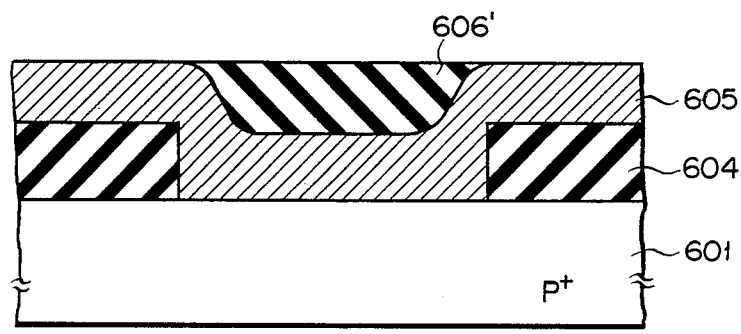
Figure 10E:
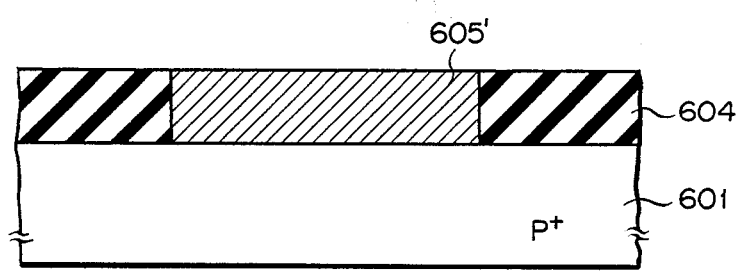
Figure 10F:
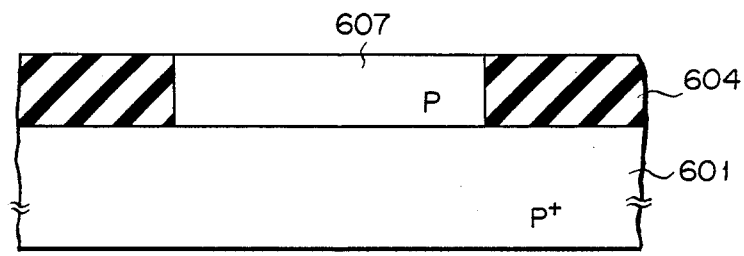

(ii) After a polycrystalline silicon layer 604 having the same thickness as that of the element isolation region 604 was deposited to cover the entire surface, as shown in FIG. 10C, a plasma nitride film 606 was deposited on the polycrystalline silicon layer 605. Subsequently, reactive ion etching was performed such that the etching rate of the flat portion of the polycrystalline silicon layer 605 was greater than that of the recess of the polycrystalline silicon layer 605, thereby leaving a residual plasma nitride film 606′ only in the recess in a self-aligned manner, as shown in FIG. 10D. The residual plasma nitride film 606′ and the polycrystalline silicon layer 605 were simultaneously etched to leave a polycrystalline silicon layer 605′ only on the island region surrounded by the element isolation region 604, as shown in FIG. 10E. Thereafter a laser beam was used to irradiate the residual polycrystalline silicon layer 605′ and convert that portion of the silicon substrate 601 which was in contact with the polycrystalline silicon layer 605′ to a monocrystalline silicon layer, thereby forming the element region 607 of a p-type monocrystalline silicon layer (FIG. 10F). Before source and drain regions and so on (to be described later) are formed, a p-type impurity such as boron may be doped in the element region 607 of the monocrystalline silicon layer to control the threshold voltage of the resultant semiconductor device.

Figure 10G:
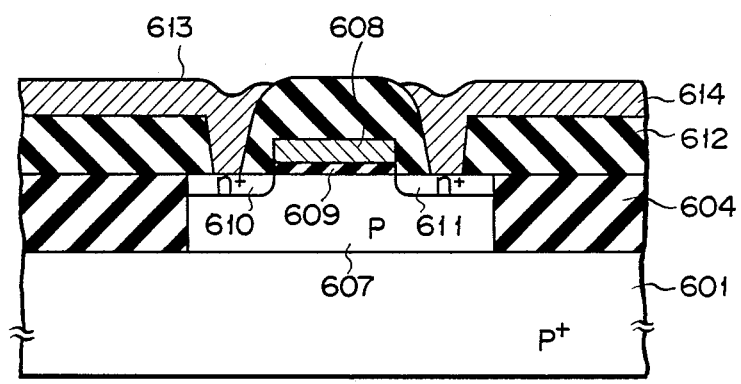

(iii) The element region 607 of p-type monocrystalline silicon surrounded by the element isolation region 604 was thermally oxidized to grow an oxide film to a thickness of 400 Å. In addition, a phosphorus-doped polycrystalline silicon film was deposited to cover the entire surface to a thickness of 3,000 Å. Using a resist pattern obtained by photoengraving as a mask, the polycrystalline silicon film was patterned by reactive ion etching to form a gate electrode 608. Subsequently, the oxide film was selectively etched using the gate electrode 608 as a mask, thereby forming a gate oxide film 609. By using the gate electrode 608 and the element isolation region 604 as masks, arsenic was diffused or ion-implanted in the element region 607 of p-type monocrystalline silicon to form n+-type source and drain regions 610 and 611 in the element region 607. In addition, a CVD-SiO₂ film 612 was deposited to cover the entire surface of the resultant structure and was patterned to form contact holes. An aluminum film was deposited and patterned to form a gate aluminum wiring layer (not shown), and source and drain aluminum wiring patterns 613 and 614, thereby producing an n-channel MOS-type semiconductor device (FIG. 10G) with the same effect as in Example 1.

In addition, in this Example, the etch-back method is performed such that the plasma nitride film is deposited and etched by RIE to leave the residual plasma nitride film in the recess of the polycrystalline silicon layer, and the residual plasma nitride film and the polycrystalline silicon layer are simultaneously etched back. However, another etch-back method may be adopted. For example, a resist film may be formed on the polycrystalline silicon layer having a groove such that the surface of the resist film becomes flat. Thereafter, the resist film is sequentially etched, and the exposed polycrystalline silicon layer portion on the element isolation region and the resist film are simultaneously etched back.

EXAMPLE 7

Example 7 was substantially the same as Example 2 except that an element region was formed in the same manner as in Example 6, thereby producing an n-channel MOS-type semiconductor device.

In this Example, the same effect as in Example 6 could be obtained. In addition, a micropatterned element isolation region having the same size as that of the resist film can be formed.

EXAMPLE 8

Example 8 was substantially the same as Example 3 except that an element region was formed in the same manner as in Example 6, thereby producing an n-channel MOS-type semiconductor device. The same effect as in Example 3 could be obtained.

EXAMPLE 9

Example 9 was substantially the same as Example 4 except that an element region was formed in the same manner as in Example 6, thereby producing an n-channel MOS-type semiconductor device. The same effect as in Example 4 could be obtained.

EXAMPLE 10

Example 10 was substantially the same as Example 5 except that an element region was formed in the same manner as in Example 6, thereby producing an n-channel MOS-type semiconductor device. The same effect as in Example 5 could be obtained.

EXAMPLE 11

Figure 11A:
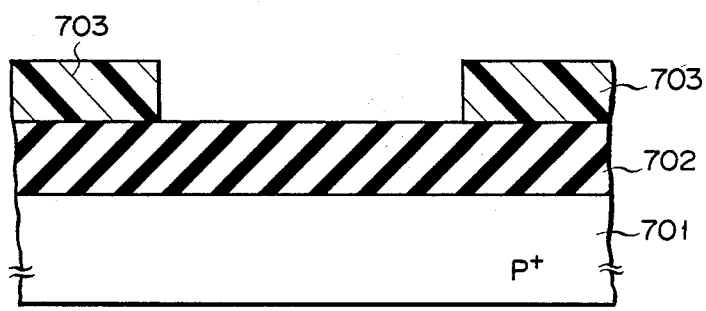
FIGS. 11A to 11D are sectional views showing the steps in manufacturing a MOS-type semiconductor device according to Example 11.
Figure 11B:
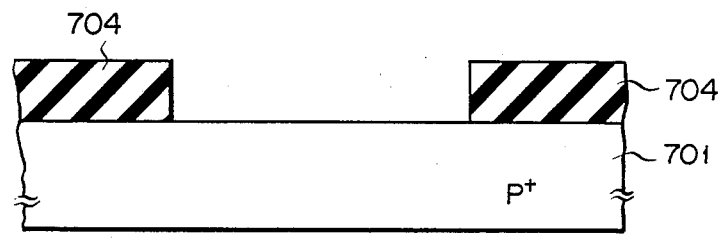

(i) An SiO$_2$ film (insulating film) 702 was grown by the CVD method to a thickness of 2 μm on a p$^+$-type silicon substrate 701 which contained boron as an impurity having a concentration of not less than 10$^{16}$/cm$^3$ (e.g., 1×10$^{18}$/cm$^3$) and which had the (100) plane. Subsequently, a photoresist film was applied to cover the entire surface and was patterned by photoengraving to cover a prospective element isolation region, thereby forming a resist pattern 703 (mask pattern) (FIG. 11A). Thereafter, the SiO$_2$ film 702 was selectively etched by reactive ion etching using the resist pattern 703 as a mask to form an element isolation region (field oxide film) 704. The resist pattern 703 on the element isolation region 704 was removed (FIG. 11B).

Figure 11C:
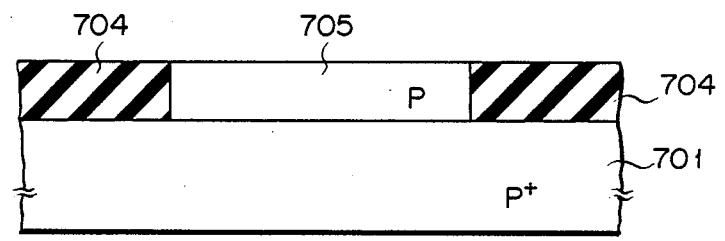
Figure 11D:
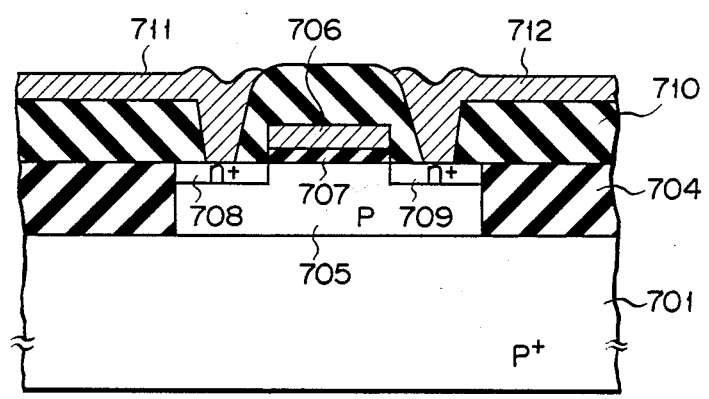

(ii) After a polycrystalline silicon layer (containing boron with an impurity of ≈10$^{15}$/cm$^3$) having the same thickness as that of the element isolation region 704 was deposited to cover the entire suface, as shown in FIG. 11C, p-type monocrystalline silicon having the same conductivity type as that of the substrate was selectively grown on the upper portion of the island region (of the substrate 701) surrounded by the element isolation region 704, thereby obtaining a p-type element region 705. Before source and drain regions were formed, boron may be doped in the monocrystalline silicon element region 705 to control the threshold voltage of the resultant semiconductor device.

(iii) The p-type monocrystalline silicon element region 705 was thermally oxidized to grow an oxide film to a thickness of 200 Å. In addition, a phosphorus-doped polycrystalline silicon film was formed to cover the entire surface to a thickness of 3,000 Å. Using a resist pattern formed by photoengraving as a mask, the polycrystalline silicon film was etched by reactive ion etching to form a gate electrode 706. Subsequently, the oxide film was selectively etched using the gate electrode 706 as a mask, thereby forming a gate oxide film 707. By using the gate electrode 706 and the element isolation region 704 as masks, arsenic was diffused or ion-implanted to form n$^+$-type source and drain regions 708 and 709 in the element isolation region 704 of the p-type monocrystalline silicon. A CVD-SiO$_2$ film 710 was deposited to cover the entire surface and was patterned to form contact holes. An aluminum film was deposited and patterned to form a gate aluminum wiring pattern (not shown), and source and drain aluminum wiring patterns 711 and 712, thereby producing an n-channel MOS-type semiconductor device, with the same effect as in Example 1.

EXAMPLE 12

Figure 12A:
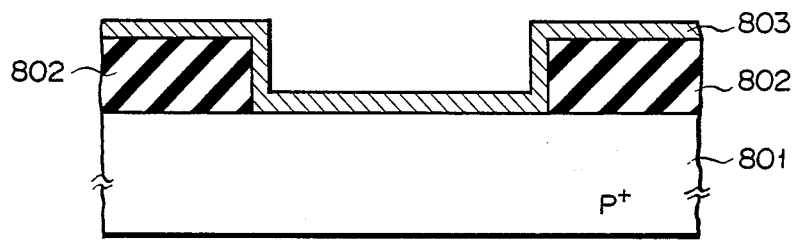
FIGS. 12A and 12B are sectional views showing some of the steps in manufacturing a MOS-type semiconductor device according to Example 12 of the present invention.
Figure 12B:
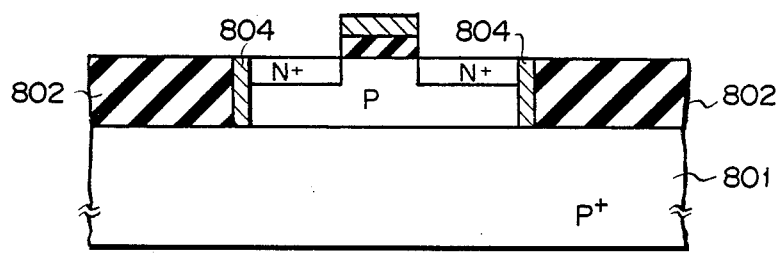

After an SiO$_2$ element isolation region 802 was formed on a p$^+$-type silicon substrate 801, a polycrystalline silicon film 803 was deposited by the CVD method to cover the entire surface (FIG. 12A). The polycrystalline silicon film 803 was selectively etched by reactive ion etching (RIE) to leave polycrystalline silicon portions on the side surfaces of the element isolation region 802, thereby obtaining residual polycrystalline silicon films 804 (FIG. 12B).

In this Example, since the polycrystalline silicon films 804 are formed on the side surfaces of the element isolation region 802, a p-type monocrystalline silicon layer (element region) can be epitaxially grown on the island region of the substrate 801 (which was surrounded by the element isolation region 802) with good adhesion with the element isolation region 802. In addition, when annealing is performed after the p-type monocrystalline silicon layer (element region) is formed, the diffusion rate of an impurity in the polycrystalline silicon patterns on the side surfaces of the element isolation region 802 is greater than that in the monocrystalline silicon layer, so that boron can be diffused from the p$^+$-type silicon substrate 801 only to the polycrystalline silicon patterns 804 which can be used as inversion preventive layers.

EXAMPLE 13

Example 13 was substantially the same as Example 2 except that an element region was formed in the same manner as in Example 11, thereby producing an n-channel MOS-type semiconductor device.

In this example, the same effect as in Example 11 can be obtained. In addition, a micropatterned element isolation region having the same size as the resist film can be obtained.

EXAMPLE 14

Example 14 was substantially the same as Example 3 except that an element region was formed in the same manner as in Example 11, thereby producing an n-channel MOS-type semiconductor device. The same effect as in Example 3 could be obtained.

EXAMPLE 15

Example 15 was substantially the same as Example 4 except that an element region was formed in the same manner as in Example 11, thereby producing an n-channel MOS-type semiconductor device. The same effect as in Example 4 could be obtained.

EXAMPLE 16

Example 16 was substantially the same as Example 5 except that an element region was formed in the same manner as in Example 11, thereby producing an n-channel MOS-type semiconductor device. The same effect as in Example 5 could be obtained.

EXAMPLE 17

Figure 13A:
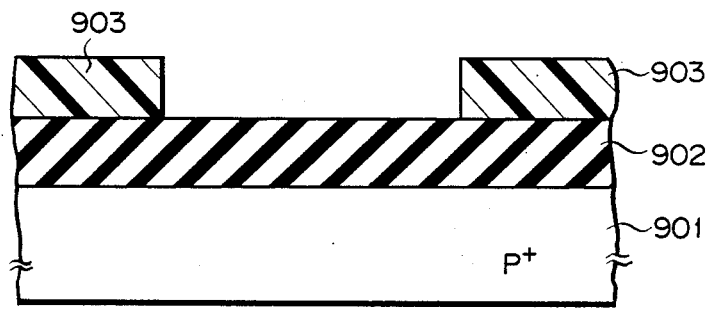
FIGS. 13A to 13E are sectional views showing the steps in manufacturing a MOS-type semiconductor device according to Example 17 of the present invention.
Figure 13B:
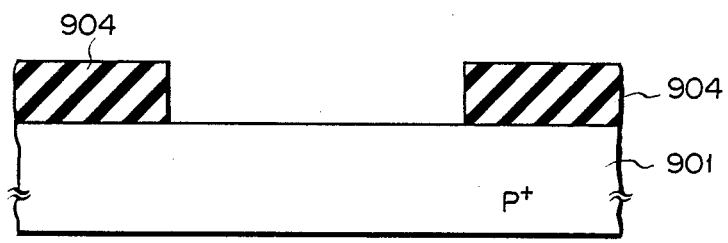

(i) An SiO$_2$ film (insulating film) 902 was grown by the CVD method to a thickness of 2 μm on a p$^+$-type silicon substrate 901 which countained boron as an impurity having a concentration of not less than 10$^{16}$/cm$^3$ (e.g., 1×10$^{18}$/cm$^3$) and which had the (100) plane. Subsequently, a photoresist film was applied to cover the entire surface and was patterned by photoengraving to cover a prospective element isolation region, thereby forming a resist pattern 903 (mask pattern) (FIG. 13A). Thereafter, the SiO$_2$ film 902 was selectively etched by reactive ion etching using the resist pattern 903 as a mask to form an element isolation region (field oxide film) 904. The resist pattern on the element isolation region 904 was removed (FIG. 13B).

Figure 13C:
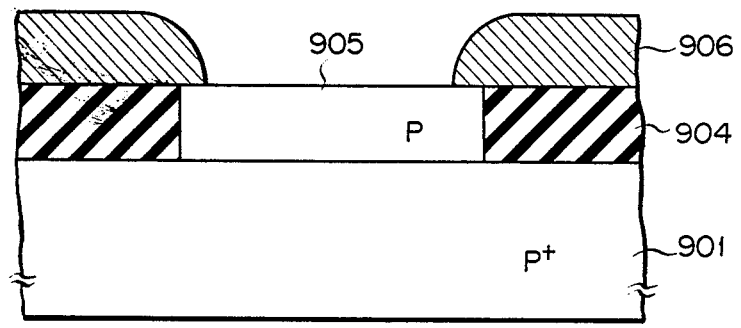
Figure 13D:
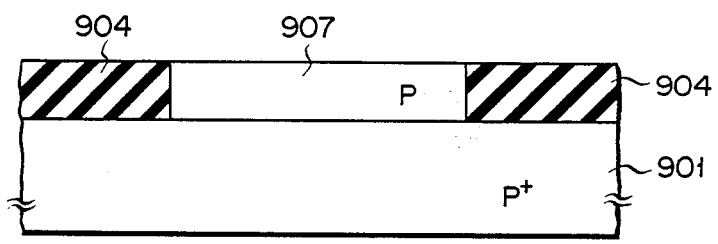
Figure 13E:
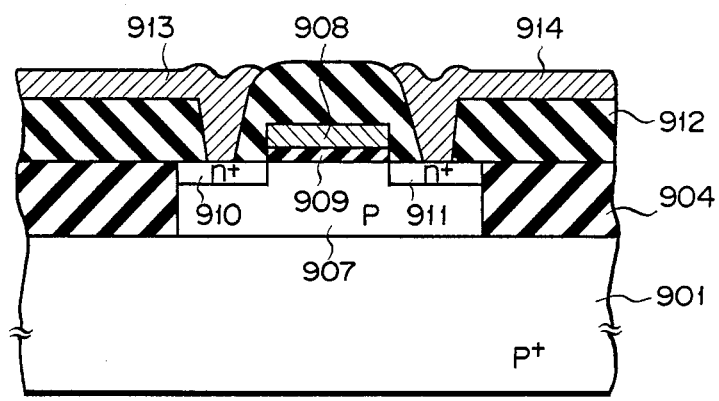

(ii) A p-type silicon layer having the same thickness as that of the element isolation region 904 was grown to cover the entire surface of the resultant structure. In this case, as shown in FIG. 13C, a monocrystalline silicon layer 905 was formed on the island region of the p+-type silicon substrate 901 which was surrounded by the element isolation region 904, and a polycrystalline silicon layer 906 was formed in the vicinity of the upper surface of the SiO₂ element isolation region 904. The resultant structure was etched by a mixture (etchant) of hydrofluoric acid:nitric acid:acetic acid=1:3:3. In this case, this etchant had etching selectivity with respect to the polycrystalline silicon, so that the monocrystalline silicon layer 905 was not etched. The monocrystalline silicon layer 905 was left on the upper surface of the substrate 901 which was surrounded by the element isolation region 904, thereby forming an element region 907 (FIG. 13D). If monocrystalline silicon is slightly etched, the thickness of the monocrystalline silicon layer 905 must be set to be greater than that of the polycrystalline silicon layer 906. In addition to this modification, before source and drain regions are formed, boron may be doped in the element region 907 to control the threshold voltage of the resultant semiconductor device.

(iii) The p-type monocrystalline silicon element region 907 isolated by the element isolation region 904 was thermally oxidized to grow an oxide film to a thickness of 200 Å. In addition, a phosphorus-doped polycrystalline silicon film was formed to cover the entire surface to a thickness of 3,000 Å. Using a resist pattern formed by photoengraving as a mask, the polycrystalline silicon film was etched by reactive ion etching to form a gate electrode 908. Subsequently, the oxide film was selectively etched using the gate electrode 909 as a mask, thereby forming a gate oxide film 909. By using as masks the gate electrode 908 and the element isolation region 904, arsenic was diffused or ion-implanted to form n+-type source and drain regions 910 and 911 in the element region 907 of the p-type monocrystalline silicon. A CVD-SiO₂ film 912 was deposited to cover the entire surface and was patterned to form contact holes. An aluminum film was deposited and patterned to form a gate aluminum wiring pattern (not shown), and source and drain aluminum wiring patterns 913 and 914, thereby producing an n-channel MOS-type semiconductor device.

In this Example, the same effect as in Example 1 could be obtained.

EXAMPLE 18

Polycrystalline silicon films were formed on the side surfaces of the element isolation region in the same manner as Example 12, and on the element region in the same manner as in Example 17. In this Example, the same effect as in Example 12 could be obtained.

EXAMPLE 19

Example 19 was substantially the same as Example 2 except that an element region was formed in the same manner as in Example 17, thereby producing an n-channel MOS-type semiconductor device.

In this Example, the same effect as in Example 17 could be obtained. In addition, a micropatterned element isolation region having the same size as the resist film could be obtained.

EXAMPLE 20

Example 20 was substantially the same as Example 3 except that an element region was formed in the same manner as in Example 17, thereby producing an n-channel MOS-type semiconductor device. The same effect as in Example 3 could be obtained.

EXAMPLE 21

Example 21 was substantially the same as Example 4 except that an element region was formed in the same manner as in Example 17, thereby producing an n-channel MOS-type semiconductor device. The same effect as in Example 4 could be obtained.

EXAMPLE 22

Example 16 was substantially the same as Example 5 except that an element region was formed in the same manner as in Example 17, thereby producing an n-channel MOS-type semiconductor device. The same effect as in Example 5 could be obtained.

In Examples 1 to 22, a p-type monocrystalline silicon layer may be formed and annealed after the boron-doped SiO₂ element isolation region is formed, so that a p+-type inversion preventive layer may be formed by diffusing boron from the element isolation region to the opposing side walls of the monocrystalline silicon layer. In this case, the boron-doped SiO₂ region can be formed by a method wherein a boron-doped SiO₂ film is patterned, or a method in which boron is ion-implanted in the side surfaces of an SiO₂ element isolation region. In particular, according to the latter method, ion implantation need not be performed when the side surfaces of the element isolation region of FIG. 9 are tapered. Ions can be vertically ion-implanted, thereby simplifying ion implantation. In addition, in Examples 11 to 22, while the monocrystalline silicon layer (and the polycrystalline silicon layer) is formed slightly after the element isolation region is formed on the p+-type silicon substrate, boron may be ion-implanted in the monocrystalline silicon layer. Therefore, boron can be directly doped in the portions of the monocrystalline silicon layer which are located at the side walls of the element isolation region.

Figure 14:
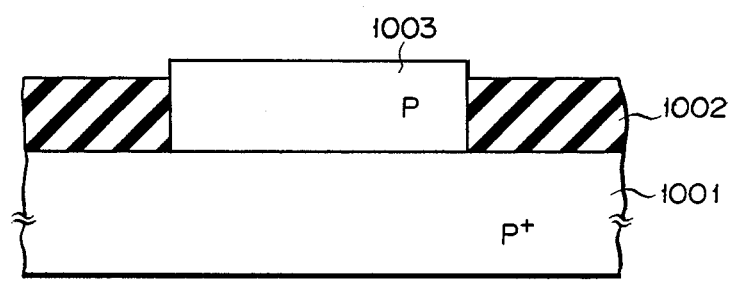
FIGS. 14 and 15, respectively, are sectional views showing modifications of the element regions isolated by element isolation regions.
Figure 15:
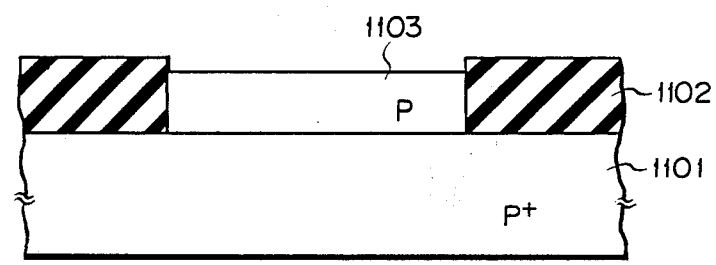

In the above examples, the p-type monocrystalline silicon layer serving as the element region has the same thickness as that of the element isolation region. However, the thickness of the p-type monocrystalline silicon layer need not be set to be the above-mentioned thickness. For example, as shown in FIG. 14, the thickness of the p-type monocrystalline silicon layer can be greater than that of an element isolation region 1002 to obtain an element region 1003. Alternatively, the thickness of the p-type monocrystalline silicon layer can be smaller than that of an element isolation region 1102 to obtain an element region 1103.

In the above examples, a monocrystalline insulating substrate such as a sapphire substrate may be used in place of the p+-type silicon substrate The present invention is not limited to the manufacture of an n-channel MOS-type semiconductor device, but can be extended to the manufacture of a CMOS, a MNOS, a MAOS, or a MES semiconductor device, or an ECL or I²L device.

According to the present invention as described above in detail, an element isolation region is formed on a semiconductor base (substrate), and the element region of a monocrystalline semiconductor layer formed on the semiconductor substrate portion surrounded by the element isolation region is at substantially the same level as that of the element isolation region. Residual resist portions at the edges of the element isolation region, residual gate electrode material, and the disconnection of the aluminum wiring layer can all be prevented. In addition, the change in substrate potential due to the substrate current can be prevented since the substrate has a high impurity concentration. Therefore, a highly integrated and reliable semiconductor device can be prepared. According to the method of the present invention, a micropatterned element isolation region can be obtained by a simple process. In addition, a channel stopper is automatically formed under the element isolation region due to the high impurity concentration in the substrate, thereby making a specific manufacturing process unnecessary. Therefore, high-performance semiconductor devices can be manufactured in a mass production line.

What is claimed is:

1. A semiconductor device comprising a semiconductor substrate, an element isolation layer of an insulating material having an entire lower portion formed on a monocrystalline semiconductor film formed on said semiconductor substrate, a monocrystalline semiconductor layer formed on a portion of said semiconductor substrate and isolated by said element isolation layer, said monocrystalline semiconductor film having the same conductivity type as that of an impurity contained in said semiconductor substrate and having an impurity concentration lower than that of a concentration of an impurity contained in said semiconductor substrate with said element isolation layer and said monocrystalline semiconductor layer being formed directly on said monocrystalline semiconductor film and having an impurity of the same conductivity type as said substrate and an impurity concentration lower than that of said monocrystalline silicon film, and a semiconductor element formed in said monocrystalline semiconductor layer, wherein an impurity concentration of at least a surface region of the semiconductor substrate covered with the element isolation layer is not less than $10^{16}/cm^3$.

2. A semiconductor device comprising a semiconductor substrate, an element isolation layer of an insulating material formed on said semiconductor substrate, a monocrystalline semiconductor layer having the same conductivity type as that of an impurity contained in said semiconductor substrate and formed on a portion of said semiconductor substrate and isolated by said element isolation layer, said monocrystalline semiconductor layer having a lower portion within said semiconductor substrate having an impurity concentration lower than that of said semiconductor substrate and higher than that of the remainder of said monocrystalline semiconductor layer, and a semiconductor element formed in said monocrystalline semiconductor layer, wherein an impurity concentration of at least a surface region of the semiconductor substrate covered with the element isolation layer is not less than $10^{16}/cm^3$.

3. A semiconductor device comprising a semiconductor substrate, an element isolation layer of an insulating material formed on said semiconductor substrate and having side walls with polycrystalline film formed thereon and in direct contact with said semiconductor substrate, a monocrystalline semiconductor layer formed on a portion of said semiconductor substrate and isolated by said element isolation layer, and a semiconductor element formed in said monocrystalline semiconductor layer, wherein an impurity concentration of at least a surface region of the semiconductor substrate covered with the element isolation layer is not less than $10^{16}/cm^3$.

* * * * *